United States Patent
Jin et al.

(10) Patent No.: US 11,953,552 B2
(45) Date of Patent: Apr. 9, 2024

(54) SYSTEM AND APPARATUS FOR MONITORING PARTIAL DISCHARGES IN SWITCHBOARDS

(71) Applicant: LS ELECTRIC CO., LTD., Anyang-si (KR)

(72) Inventors: Chang Hwan Jin, Anyang-si (KR); Jong Ung Choi, Anyang-si (KR); Hyun Ho Kwon, Anyang-si (KR); Gwang Goo Kang, Anyang-si (KR); Jin Ho Lee, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 147 days.

(21) Appl. No.: 17/435,737

(22) PCT Filed: Jul. 16, 2019

(86) PCT No.: PCT/KR2019/008780
§ 371 (c)(1),
(2) Date: Sep. 2, 2021

(87) PCT Pub. No.: WO2020/179976
PCT Pub. Date: Sep. 10, 2020

(65) Prior Publication Data
US 2022/0137135 A1    May 5, 2022

(30) Foreign Application Priority Data
Mar. 5, 2019 (KR) .................. 10-2019-0025147

(51) Int. Cl.
*G01R 31/327* (2006.01)
*H02B 13/065* (2006.01)

(52) U.S. Cl.
CPC ......... *G01R 31/327* (2013.01); *H02B 13/065* (2013.01)

(58) Field of Classification Search
CPC .............. G01R 31/327; G01R 31/1227; H02B 13/065; H02B 13/0356
See application file for complete search history.

(56) References Cited

U.S. PATENT DOCUMENTS

| | | | | |
|---|---|---|---|---|
| 5,200,737 A | * | 4/1993 | Konishi | ............. G01R 31/3275 361/85 |
| 2012/0185185 A1 | * | 7/2012 | Bae | .......................... H04Q 9/00 702/58 |

(Continued)

FOREIGN PATENT DOCUMENTS

| | | |
|---|---|---|
| JP | H08152453 A | 6/1996 |
| JP | 2011085393 A | 4/2011 |

(Continued)

OTHER PUBLICATIONS

International Search Report for related International Application No. PCT/KR2019/008780; action dated Sep. 10, 2020; (5 pages).

(Continued)

*Primary Examiner* — Neel D Shah
*Assistant Examiner* — Adam S Clarke
(74) *Attorney, Agent, or Firm* — K&L Gates LLP (57) ABSTRACT

The present disclosure relates to a system and apparatus for monitoring a partial discharge in a switchboard, including a plurality of partial discharge sensors provided in each of a plurality of switchboards to acquire partial discharge data generated in at least one switchboard, and a noise sensor provided in any one of the plurality of switchboards to acquire noise data to be differentiated from the partial discharge data acquired from the at least one partial discharge sensor, and it can be applied to other exemplary embodiments.

7 Claims, 5 Drawing Sheets

(56) References Cited

U.S. PATENT DOCUMENTS

| | | | |
|---|---|---|---|
| 2013/0275063 A1* | 10/2013 | Lee | G01R 29/26 |
| | | | 702/58 |
| 2015/0260778 A1* | 9/2015 | Park | G01R 31/14 |
| | | | 324/536 |
| 2018/0252759 A1* | 9/2018 | Primack | G01S 5/06 |
| 2020/0018785 A1* | 1/2020 | Yuyama | G06T 7/0004 |

FOREIGN PATENT DOCUMENTS

| | | |
|---|---|---|
| KR | 20090075657 A | 7/2009 |
| KR | 20130060073 A | 6/2013 |
| KR | 101475002 B1 | 12/2014 |
| KR | 101641515 B1 | 7/2016 |

OTHER PUBLICATIONS

Written Opinion for related International Application No. PCT/KR2019/008780; action dated Sep. 10, 2020; (5 pages).

\* cited by examiner

SYSTEM AND APPARATUS FOR MONITORING PARTIAL DISCHARGES IN SWITCHBOARDS

CROSS-REFERENCE TO RELATED APPLICATIONS

The present application is a National Stage of International Application No. PCT/KR2019/008780 filed on Jul. 16, 2019, which claims the benefit of Korean Patent Application No. 10-2019-0025147, filed on Mar. 5, 2019, with the Korean Intellectual Property Office, the entire contents of each hereby incorporated by reference.

FIELD

The present disclosure relates to a system and apparatus for monitoring a partial discharge in a switchboard.

BACKGROUND

The partial discharge generically refers a discharge generated in any part of power equipment systems such as power reception equipment high-voltage switchboards installed in various industries and power grid substations, high-pressure cables, transformers, gas insulated switchgears (GIS), switchgears, power reception equipment and the like. In addition, the partial discharge includes corona discharge generated near the tip of an electrode, creepage discharge generated along the surface of an insulator, void discharge generated in the voids inside an insulator and the like.

In particular, in the case of a large-size plant handling large-capacity power equipment, several dozens of switchboards are provided for each electric room. In order to install the partial discharge diagnosis system in the corresponding electric room in such a large-size plant, a noise sensor is installed for each of the diagnosis devices installed in each switchboard, and the diagnosis of a partial discharge is performed by using the respective noise data acquired by each noise sensor. Therefore, when a large amount of switchboards is installed, since a larger amount of noise sensors must be installed in each switchboard, a problem arises in that the purchase cost and the installation cost of noise sensors are increased, and a problem occurs in that the installation time of noise sensors is increased.

SUMMARY

The exemplary embodiments for solving the conventional problems as above are directed to providing a system and apparatus for monitoring a partial discharge in a switchboard, which are capable of monitoring the partial discharge in a state where the installation of noise sensors is minimized by grouping a plurality of switchboards to provide a noise sensor for each group.

The system for monitoring a partial discharge according to an exemplary embodiment of the present disclosure includes a plurality of partial discharge sensors provided in each of a plurality of switchboards to acquire partial discharge data generated in at least one switchboard, and a noise sensor provided in any one of the plurality of switchboards to acquire noise data to be differentiated from the partial discharge data acquired from the at least one partial discharge sensor.

In addition, it further includes a control device for receiving partial discharge data acquired from the at least one partial discharge sensor and noise data acquired from the noise sensor, and monitoring a partial discharge based on a result value obtained by differentiating the partial discharge data and the noise data.

Moreover, the apparatus for monitoring a partial discharge according to an exemplary embodiment of the present disclosure includes a communication unit for receiving partial discharge data acquired from a plurality of partial discharge sensors provided in each of a plurality of switchboards, and noise data acquired from a noise sensor provided in any one of the plurality of switchboards, and a control unit for monitoring a partial discharge based on a result value obtained by differentiating the noise data from the partial discharge data.

In addition, the control unit sets a group including the plurality of switchboards each provided with the partial discharge sensor and any one of the switchboards provided with the noise sensor.

In addition, in order to set the group, the control unit confirms from an IP address of a partial discharge device communicating with the partial discharge sensor the locations of the partial discharge sensor and the partial discharge device, and confirms from an IP address of a partial discharge device communicating with the noise sensor the location of the noise sensor.

In addition, the control unit allocates each channel for receiving the partial discharge data and the noise data from a partial discharge device included in the group.

In addition, the control unit confirms an IP or channel of the partial discharge device that has transmitted the partial discharge data and the noise data, respectively, and confirms the group in which the partial discharge data and the noise data are generated based on the IP or channel of the partial discharge device.

In addition, if the partial discharge data and the noise data are generated in the same group, the control unit inserts a timestamp into the partial discharge data and the noise data for storage.

In addition, the control unit analyzes the pattern of the partial discharge data in which the timestamp is inserted, calls noise data having the same timestamp as the partial discharge data to analyze the pattern of the noise data when the noise gate mode is activated, and compares the pattern of the partial discharge data and the pattern of the noise data.

As described above, the system and apparatus for monitoring a partial discharge in a switchboard according to the present disclosure have effects of minimizing the purchase cost, installation cost and installation time of noise sensors, by monitoring the partial discharge in a state where the installation of noise sensors is minimized by grouping a plurality of switchboards to provide a noise sensor for each group.

DETAILED DESCRIPTION

Hereinafter, preferred exemplary embodiments according to the present disclosure will be described in detail with reference to the accompanying drawings. The detailed description disclosed below in conjunction with the accompanying drawings is intended to describe exemplary embodiments of the present disclosure and is not intended to represent the only exemplary embodiments in which the present disclosure may be practiced. In order to clearly describe the present disclosure in the drawings, parts irrelevant to the description may be omitted, and the same reference numerals may be used for the same or similar components throughout the specification.

In an exemplary embodiment of the present disclosure, expressions such as "or". "at least one" and the like may indicate one of the words listed together, or a combination of two or more. For example, "A or B" and "at least one of A and B" may include only one of A or B, or both A and B.

Figure 1:
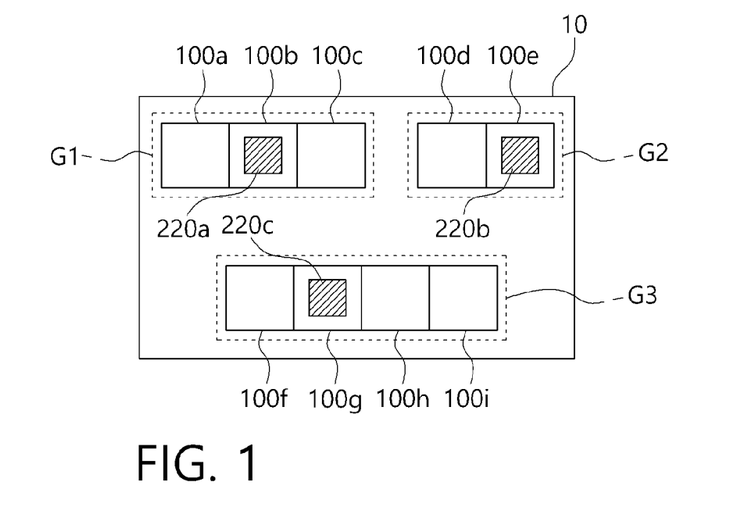
FIG. 1 is an exemplary diagram illustrating the grouped switchboards for monitoring a partial discharge according to an exemplary embodiment of the present disclosure.
Figure 2:
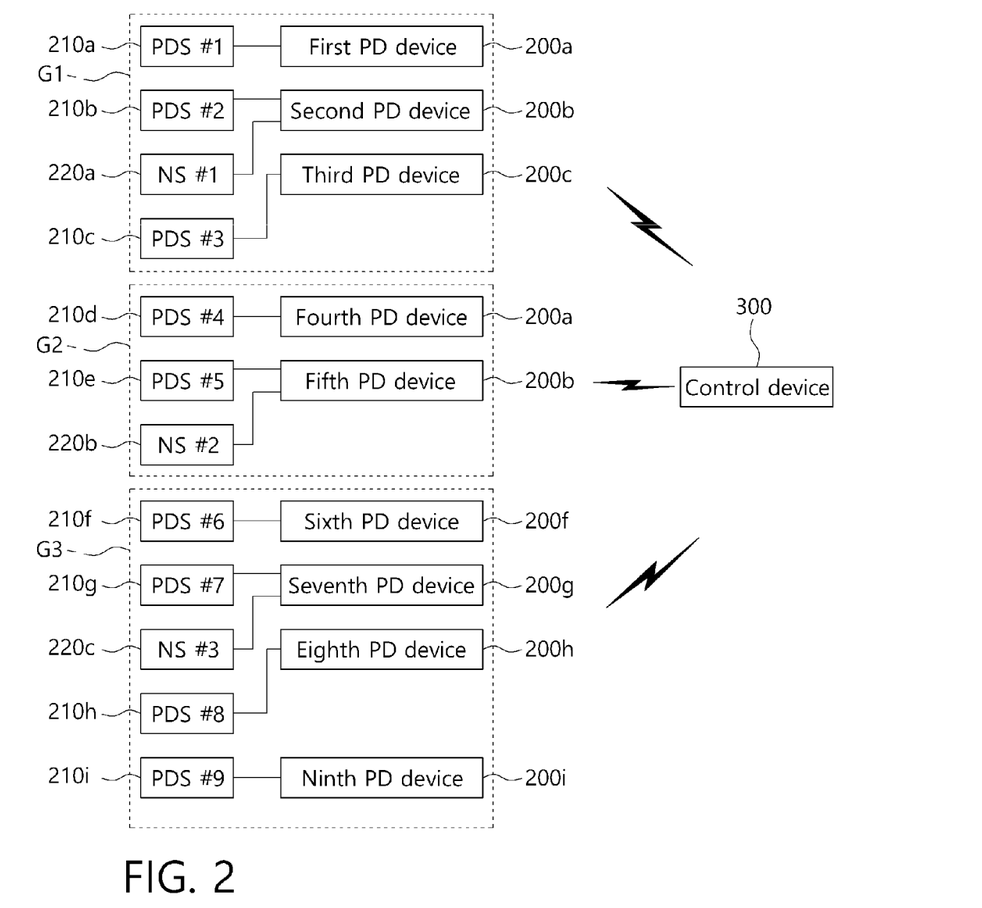
FIG. 2 is a diagram illustrating the system for monitoring a partial discharge in a switchboard according to an exemplary embodiment of the present disclosure.

FIG. 1 is an exemplary diagram illustrating grouped switchboards for monitoring a partial discharge according to an exemplary embodiment of the present disclosure, and FIG. 2 is a diagram illustrating the system for monitoring a partial discharge in a switchboard according to an exemplary embodiment of the present disclosure.

Referring to FIGS. 1 to 2, the system for monitoring a partial discharge according to the present disclosure will be described as an example in which a plurality of switchboards 100a to 100i are installed in an electric room 10.

Each of the plurality of switchboards 100a to 100i installed in the electric room 10 is provided with one partial discharge device (hereinafter, referred to as PD devices 200a to 200i), and different IP addresses may be assigned to each of the PD devices 200a to 200i. Further, each of the PD devices 200a to 200i may be connected to a partial discharge sensor (hereinafter, referred to as PDS 210a to 210i), and the second switchboard 100b, the fifth switchboard 100e, and the seventh switchboard 100g of the plurality of switchboards 100a to 100i may be provided with noise sensors (hereinafter, referred to as NS#1 220a to NS#3 220c), respectively. In this case, NS#1 a to NS#3 220c may be connected to the second PD device 200b, the fifth PD device 200e, and the seventh PD device 200g provided in the second switchboard 100b, the fifth switchboard 100e, and the seventh switchboard 100g, respectively. The PD devices 200a to 200i provided in each of the plurality of switchboards 100a to 100i transmit data acquired from sensors connected thereto to a control device 300. More specifically, the first PD device 200a to the ninth PD device 200i transmit partial discharge data acquired from the PDS#1 210a to PDS#9 210i to the control device 300. In addition, the second PD device 200b, the fifth PD device 200e and the seventh PD devices 200g transmit noise data acquired from NS#1 220a, NS#2 220b, and NS#3 220c to the control device 300.

Figure 3:
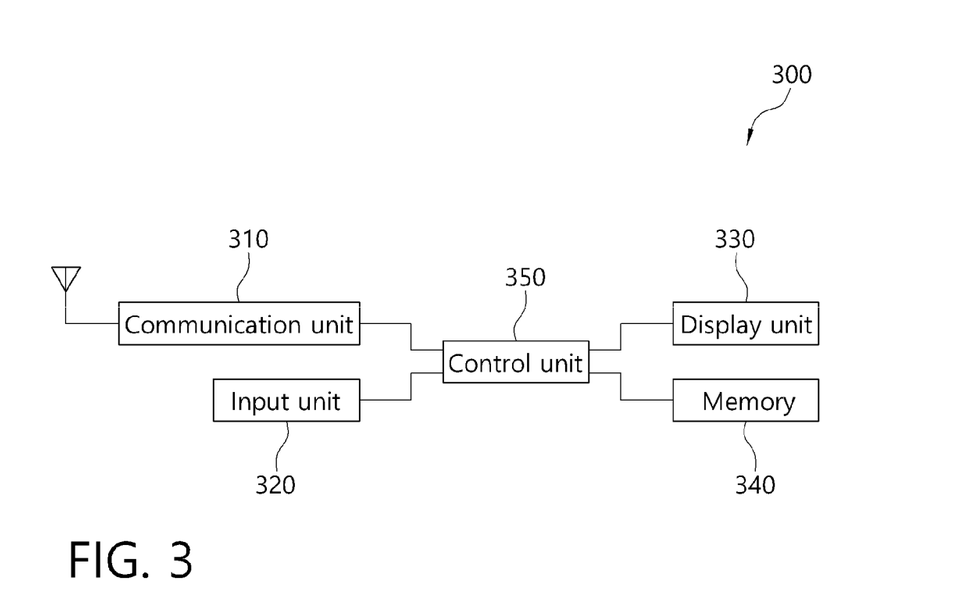
FIG. 3 is a diagram illustrating the main configuration of a control device for performing the monitoring of a partial discharge according to an exemplary embodiment of the present disclosure.

The control device 300 groups the switchboards 100a to 100i installed in the electric room 10. In this case, the control device 300 may group a plurality of switchboards 100a to 100i including PDS#1 210a to PDS#9 210i, respectively, and may group such that one group includes switchboards including any one of NS#1 220a to NS#3 220c. The control device 300 monitors partial discharges generated in the grouped switchboards. The operation of the control device 300 will be described in detail with reference to FIG. 3 below. FIG. 3 is a diagram illustrating the main configuration of a control device for performing the monitoring of a partial discharge according to an exemplary embodiment of the present disclosure.

Referring to FIG. 3, the control device 300 for monitoring a partial discharge according to the present disclosure includes a communication unit 310, an input unit 320, a display unit 330, a memory 340 and a control unit 350.

The communication unit 310 communicates with PD devices 200a to 200i installed in the switchboards 100a to 100i. To this end, the communication unit 310 may perform wireless communication, such as wireless fidelity (Wi-Fi), bluetooth, bluetooth low energy (BLE) and the like, and wired communication such as a USB cable and the like, with the PD devices 200a to 200i.

The input unit 320 generates input data in response to an input of the manager of the control device 300. The input unit 320 includes at least one input means. To this end, the input unit 320 may include a keyboard, a mouse, a keypad, a dome switch, a touch panel, a touch key, a button and the like.

The display unit 330 outputs output data corresponding to the operation of the control device 300. To this end, the display unit 330 may include a liquid crystal display (LCD), a light emitting diode (LED) display, an organic light-emitting diode (OLED) display, a micro-electro mechanical systems (MEMS) display and an electronic paper display. The display unit 330 may be combined with the input unit 320 and implemented as a touch screen.

The memory 340 stores operating programs of the control device 300. The memory 340 may store a design drawing of the electric room 10, In addition, the memory 340 may store installation positions of the switchboards 100a to 100i installed in the electric room 10, for example, coordinate values in the electric room 10 and the like. In this case, the coordinate values may be set in accordance with the column and the row in which the switchboard is installed in the electric room 10, and for example, the coordinate value of the first switchboard 100a may be set in a form of 1-1, the coordinate value of the fifth switchboard 100e may be set in a form of 1-5, and the coordinate value of the ninth switchboard 100i may be set in a form of 2-4 and the like.

The memory 340 may map and store the installation positions of the switchboards 100a to 100i, the IP addresses of the PD devices 200a to 200i installed in each of the switchboards 100a to 100i, the partial discharge sensors and the noise sensors connected to each of the PD devices 200a to 200i. In addition, the memory 340 may store a channel allocated by the control unit 350, for example, a channel on which partial discharge data and noise data are to be received via the PD devices 200a to 200i.

When a group setting signal is received from the input unit 320, the control unit 350 obtains IP addresses of the PD devices 200a to 200i respectively provided in a plurality of switchboards 100a to 100i arranged in the electric room 10. In this case, the control unit 350 may obtain IP addresses through communication with the PD devices 200a to 200i, and may obtain the IP addresses by checking the IP addresses which are pre-stored in the memory 340. Based on the obtained IP addresses, the control unit 350 may check in which of the switchboards 100a to 100i the PD devices 200a to 200*i* are installed. Further, the PD devices 200*a* to 200*i* are connected to partial discharge sensors 210*a* to 210*i*, respectively.

Next, the control unit 350 may check the switchboards including NS#1 220*a* to the NS#3 220*c* among the plurality of switchboards 100*a* to 100*i* arranged in the electric room 10. That is, the NS#1 220*a* to NS#3 220*c* are connected to the PD device 200 disposed in the switchboard in which they are installed. For example, NS#1 220*a* is connected to the second PD device 200*b*, NS#2 220*b* is connected to the fifth PD device 200*e*, and NS#3 220*c* is connected to the seventh PD device 200*g*. The second PD device 200*b*, the fifth PD device 100*e* and the seventh PD device 200*g* may send to the control unit 350 that NS#1 220*a*, NS#220*b* and NS#3 220*c* are connected, respectively. Therefore, the control unit 350 may check in which of the switchboards NS#1 220*a* to NS#3 220*c* are installed.

The control unit 350 performs grouping based on the confirmed positions of the PD devices 200*a* to 200*i* and NS#1 220*a* to NS#3 220*c*. That is, the control unit 350 may set three groups based on the positions of the PD devices 200*a* to 200*i* as in FIGS. 1 and 2. For example, the control unit 350 may set the first switch board 100*a*, the second switchboard 100*b*, and the third switchboard 100*c* as the first group G1, set the fourth switchboard 100*d* and the fifth switchboard 100*e* as the second group G2, and set the sixth switchboard 100*f*, the seventh switchboard 102*g*, the eighth switchboard 100*h*, and the ninth switchboard 100*i* as the third group G3, in this case, it is preferable that the control unit 350 sets the groups such that one or more noise sensors are necessarily included in each group when setting the groups. Further, the control unit 350 may set a group based on the design drawing of the electric room 10 displayed on the display unit 330 by a selection signal which is input from the input unit 320.

The control unit 350 allocates a channel for partial discharge data and a channel for noise data to each group. More specifically, the control unit 350 allocates a channel to be used when the partial discharge data acquire from PDS#1 210*a* to PDS#9 210*i* is received via the PD devices 200*a* to 200*i*, and allocates a channel to be used when the partial discharge data acquired from NS#1 220*a* to NS#3 220*c* is received respectively via the second PD device 200*b*, the fifth PD device 200*e*, and the seventh PD device 200*g*. The control unit 350 may store a group setting result in the memory 340 if a completion signal indicating that the group setting is completed is received from the input unit 320.

When the group setting is completed as described above, the control unit 350 monitors partial discharges generated in the switchboards. More specifically, the control unit 350 receives partial discharge data and noise data from at least one of the PD devices 200*a* to 200*i*. For example, the control unit 350 receives partial discharge data from first PD device 200*a* connected to PDS#1 210*a*, and receives noise data from the second PD device 200*h* connected to NS#1 220*a*. The control unit 350 confirms the IP address of the first PD device 200*a* that has transmitted the partial discharge data or the channel on which the partial discharge data has been received. In addition, the control unit 350 confirms the IP address of the second PD device 200*b* that has transmitted the noise data or the channel on which the noise data has been received. The control unit 350 may confirm that the first PD device 200*a* and the second PD device 200*b* are devices included in the same first group G1 based on the IP addresses or confirmed channels of the confirmed first PD device 200*a* and second PD device 200*b*.

When it is confirmed that the received partial discharge data and noise data are data generated in the same first group G1, the control unit 350 inserts a timestamp into the partial discharge and noise data in units of a certain time, for example, 10 seconds. In this case, the control unit 350 may insert a timestamp in a unit of a certain time based on the time point at which the partial discharge data and noise data are received. In addition, the PD devices 200*a* to 200*i* may transmit the respective data to the control unit 350 in a synchronized state based on the time point at which the partial discharge data and noise data are acquired from the respective sensors. In this case, the control unit 350 may insert a timestamp into the synchronized partial discharge data and noise data in a certain time unit. The control unit 350 stores the partial discharge data and noise data into which the timestamp is inserted in the memory 340.

The control unit 350 analyzes the pattern of the received partial discharge data, and calls the noise data having the same timestamp as the pattern-analyzed partial discharge data if the noise gate mode is activated. In general, the partial discharge data acquired from the partial discharge sensor may include noise data generated in switchboards. Therefore, the control unit 350 may activate the noise gate mode to remove the noise data included in the partial discharge data. When it is confirmed that the pattern-analyzed partial discharge data includes noise data, the control unit 350 may call the corresponding noise data. For example, when it is confirmed that the noise data is included in the partial discharge data between 30 seconds and 60 seconds as a result of the pattern analysis, the control unit 350 may call the noise data between 30 seconds and 60 seconds.

The control unit 350 analyzes the pattern of the called noise data and compares the pattern analysis result of the partial discharge data with the pattern analysis result of the noise data. When the pattern of the partial discharge data is the same as that of the noise data, the control unit 350 differentiates the two data. In this way, by differentiating between the partial discharge data and the noise data, noise data included in the partial discharge data may be deleted. The control unit 350 reanalyzes the pattern of the partial discharge data from which the noise data has been deleted, and displays the pattern analysis result on the display unit 330. For example, the control unit 350 may remove all of the noise data included in the partial discharge data by differentiating the noise data acquired from the NS#1 220*a* from the partial discharge data acquired from the PDS# 1 210*a*. The control unit 350 may reanalyze the pattern of the partial discharge data from which the noise data has been removed to check whether the partial discharge exists in the switchboard in which the first PD device 200*a* is installed, the size thereof and the like, and display the same on the display unit 330.

Figure 4:
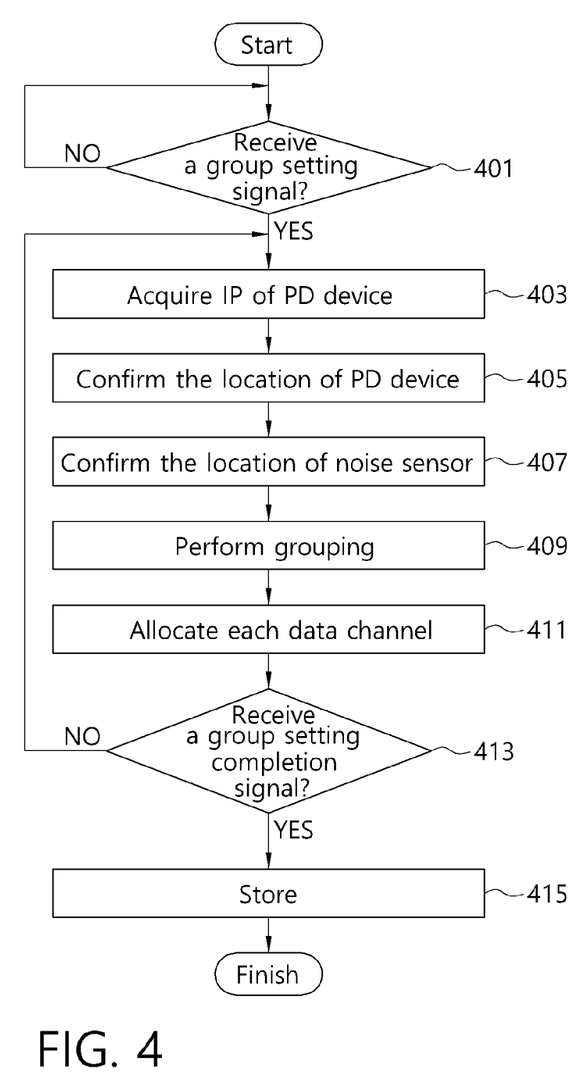
FIG. 4 is a flowchart for describing the method of grouping switchboards for monitoring a partial discharge according to an exemplary embodiment of the present disclosure.

FIG. 4 is a flowchart for describing the method of grouping switchboards for monitoring a partial discharge according to an exemplary embodiment of the present disclosure.

Referring to FIGS. 1 to 4, in Step 401, the control unit 350 confirms whether a group setting signal is received from the input unit 320. As a result of the confirmation in Step 401, if the group setting signal is received, the control unit 350 performs Step 403, and if no group setting signal is received, it waits for the reception of the group setting signal.

In Step 403, the control unit 350 obtains IP addresses of partial discharge devices (hereinafter, referred to as PD devices 200*a* to 200*i*) respectively provided in a plurality of switchboards 100*a* to 100*i* arranged in the electric room 10.

In Step 405, the control unit 350 checks the positions of the PD devices 200a to 200i based on the obtained IP addresses. In this case, since the PD devices 200a to 200i are generally incorporated in the switchboards 100a to 100i, the control unit 350 may confirm, based on the IP addresses, in which of the switchboards 100a to 100i the PD devices 200a to 200i are installed. Further, since each of the PD devices 200a to 200i is connected to the PDS 210a to 210i, the control unit 350 may confirm in which of the switchboards 100a to 100i each of the PDSs 210a acid 210i is installed.

In Step 407, the control unit 350 may check the switchboards including noise sensors (hereinafter, referred to as NS#1 220a to NS#3 220c) among the plurality of switchboards 100a to 100i disposed in the electric room 10. That is. NS#1 220a to NS#3 220c are connected to the PD device 200 disposed in the switchboard in which they are installed. For example, as shown in FIG. 2, NS#1 220a is connected to the second PD device 200b, NS#2 220b is connected to the fifth PD device 200e, and NS#3 220c is connected to the seventh PD device 200g. The second PD device 200b, the fifth PD device 200e and the seventh PD device 200g may send to the control unit 350 that NS#1 220a, NS#2 220b and NS#3 220c are connected, respectively. Therefore, the control unit 350 may check in which of the switchboards NS#1 220a to NS#3 220c are installed.

In Step 409, the control unit 350 performs grouping based on the confirmed positions of the PD devices 200a to 200i and the NS#1 220a to NS#3 220c. That is, the control unit 350 may set three groups based on the positions of the PD devices 200a to 200i as in FIGS. 1 and 2. For example, the control unit 350 may set the first switch board 100a, the second switchboard 100, and the third switchboard 100c as the first group G1, set the fourth switchboard 100d and the fifth switchboard 100e as the second group G2, and set the sixth switchboard 100f, the seventh switchboard 100g, the eighth switchboard 100h, and a ninth switchboard 100i as the third group G3. In this case, it is preferable that the control unit 350 sets the groups such that one or more noise sensors are necessarily included in each group when setting the groups.

In Step 411, the control unit 350 allocates a channel for partial discharge data and a channel for noise data to each group. More specifically, the control unit 350 allocates a channel to be used when the partial discharge data acquired from PDS#1 210a to PDS#9 210i is received via the PD devices 200a to 200i, and allocates a channel to be used when the partial discharge data acquired from NS#1 220a to NS#3 220c is received via the second PD device 200b, the fifth PD device 200e, and the seventh PD device 200g, respectively.

In Step 413, the control unit 350 may perform Step 415 if a completion signal indicating that the group setting is completed is received from the input unit 320, and may return to Step 403 and re-perform the operations of Steps 403 to 411 if the completion signal is not received. In Step 415, the control unit 350 may store the group setting result in the memory 340.

Figure 5:
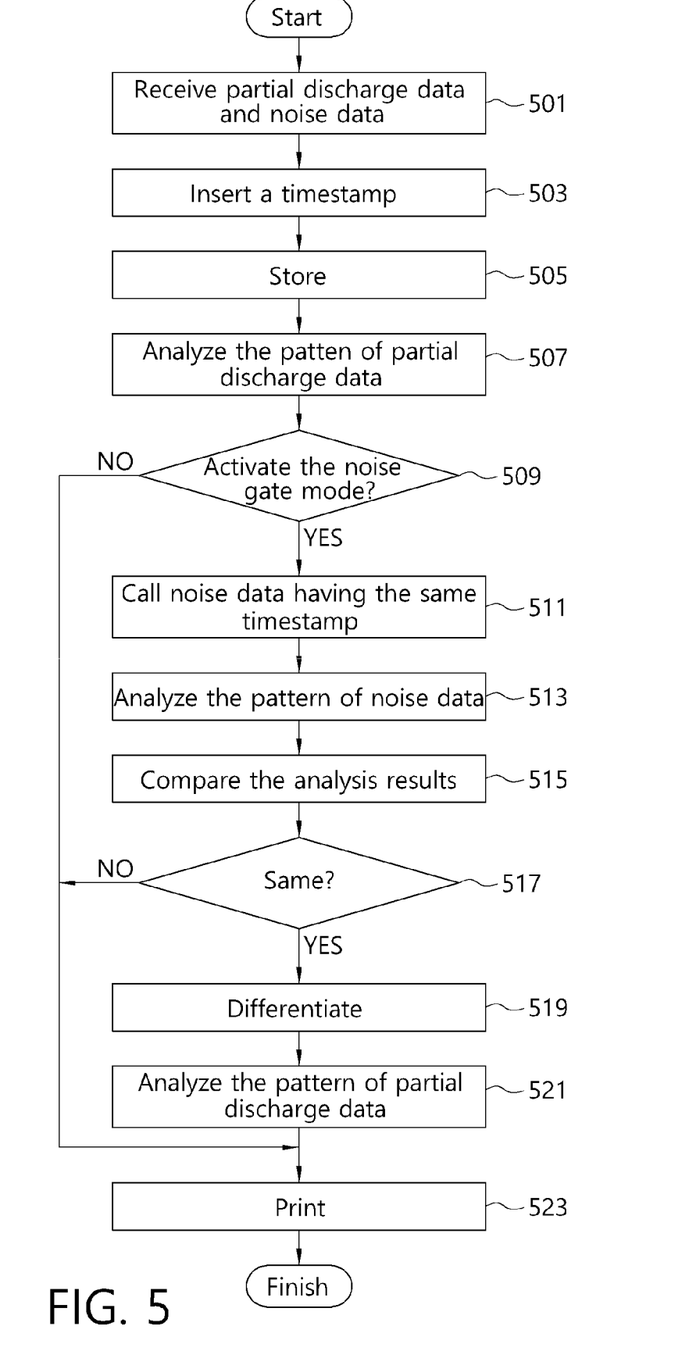
FIG. 5 is a flowchart for describing the method of monitoring a partial discharge according to an exemplary embodiment of the present disclosure.

FIG. 5 is a flowchart for describing the method of monitoring a partial discharge according to an exemplary embodiment of the present disclosure.

Referring to FIG. 5, in Step 501, the control unit 350 receives partial discharge data and noise data from at least one of the PD devices 200a to 200i. For example, the control unit 350 receives partial discharge data from the first PD device 200a connected to PDS#1 210a, and receives noise data from the second PD device 200b connected to NS#1 220a. The control unit 350 checks the IP address of the first PD device 200a that has transmitted the partial discharge data or the channel on which the partial discharge data has been received. In addition, the control unit 350 checks the IP address of the second PD device 200b that has transmitted the noise data or the channel on which the noise data has been received. The control unit 350 may confirm that the first PD device 200a and the second PD devices 200b are devices included in the same first group G1 based on the IP addresses or the confirmed channels of the confirmed first PD device 200a and second PD device 200b.

In Step 505, when it is confirmed that the received partial discharge data and noise data are data generated in the same first group G1, the control unit 350 inserts a timestamp into the partial discharge and noise data for a certain period of time, for example, 10 seconds. The control unit 350 performs Step 505 after inserting the timestamp. In Step 505, the control unit 350 stores the partial discharge data and noise data into which the timestamp is inserted in the memory 340.

In Step 507, the control unit 350 analyzes the pattern of the received partial discharge data. In Step 509, the control unit 350 performs Step 511 if the noise gate mode is activated, and performs Step 523 if the noise gate mode is not activated. To this end, the control unit 350 may receive a signal from the input unit 320 to activate the noise gate mode. In Step 523, the control unit 350 displays the pattern analysis result of the partial discharge data on the display unit 330. Further, the noise gate mode means a mode for removing noise data included in the partial discharge data.

In Step 511, the control unit 350 calls noise data having the same timestamp as the pattern-analyzed partial discharge data in Step 507. In general, the partial discharge data acquired from the partial discharge sensor may include noise data generated in switchboards. Accordingly when it is confirmed that the pattern-analyzed partial discharge data includes noise data, the control unit 350 may call the corresponding noise data. For example, when it is confirmed that the noise data is included in the partial discharge data between 30 seconds and 60 seconds as a result of the pattern analysis, the control unit 350 may call the noise data between 30 seconds and 60 seconds.

In Step 513, the control unit 350 analyzes the pattern of the called noise data and performs Step 515. In Step 515, the control unit 350 compares the pattern analysis result of the partial discharge data with that of the noise data and performs Step 517, In Step 517, the control unit 350 performs Step 519 if the pattern of the partial discharge data is the same as that of the noise data, and performs Step 523 if the patterns of the two data are not the same.

In Step 519, the control unit 350 differentiates between two data having the same pattern. In Step 521, the control unit 350 differentiates between the partial discharge data and the noise data, and then reanalyzes the pattern of the partial discharge data to perform Step 523. In Step 523, the control unit 350 displays the pattern analysis result of the partial discharge data on the display unit 330. For example, the control unit 350 may remove all of the noise data included in the partial discharge data by differentiating the noise data acquired from the NS#1 220a from the partial discharge data acquired from the PDS#1 210a, The control unit 350 may reanalyze the pattern of the partial discharge data from which the noise data has been removed to monitor and display information on partial discharges generated in the switchboard, in which the first PD device 200a is installed, on the display unit 330. In addition, in an exemplary embodiment of the present disclosure, the partial discharge data received from the first PD device 200a connected to the PDS#1 210*a* and the noise data received form the second PD device 200 connected to the NS#1 220*a* are used to monitor the information on the partial discharges in the first switchboard 100*a* in which the first PD device 200 is installed, but is not necessarily limited thereto. For example, the information on partial discharges generated in the first switchboard 100*a*, the second switchboard 100*b* and the third switchboard 100*c* included in the first group G1 may be monitored simultaneously or sequentially in such a manner as described above.

The exemplary embodiments of the present disclosure disclosed in the present specification and drawings are only provided as specific examples in order to easily explain the technical contents of the present disclosure and help the understanding of the present disclosure, and are not intended to limit the scope of the present disclosure. Therefore, the scope of the present disclosure should be construed such that in addition to the exemplary embodiments disclosed herein, all variations or modifications derived based on the technical spirit of the present disclosure are included in the scope of the present disclosure.

The invention claimed is:

1. A system for monitoring a partial discharge, comprising:
   a plurality of groups, each group including a plurality of switchboards, each switchboard including a partial discharge sensor and one switchboard in each group including a single noise sensor for that group; and
   a control device, wherein:
   each partial discharge sensor acquires partial discharge data generated in a corresponding switchboard, and transmits the partial discharge data to the control device; and
   the single noise sensor for each group acquires noise data for that group and transmits the noise data for that group to the control device; and
   the control device monitors the partial discharge based on a result value obtained by differentiating the partial discharge data received from partial discharge sensors associated with a given group of the plurality of groups against the noise data received from the single noise sensor associated with the given group.

2. An apparatus for monitoring a partial discharge, configured to:
   set a plurality of switchboards into a plurality of groups that each include a subset of the plurality of switchboards, wherein each switchboard of the plurality of switchboards is provided a corresponding partial discharge sensor from a plurality of discharge sensors, and wherein each group of the plurality of groups is set such a single noise sensor is included in that group that is included in a given one switchboard set within that group;
   receive partial discharge data acquired from the plurality of partial discharge sensors provided in the plurality of switchboards, and noise data acquired from the single noise sensor provided in the given one switchboard associated with each group of the plurality of groups; and
   monitor a partial discharge based on a result value obtained by differentiating the noise data from the partial discharge data.

3. The apparatus of claim 2, wherein setting the plurality of switchboards into the plurality of groups further comprises confirming from an Internet Protocol (IP) address of a first partial discharge device communicating with a given partial discharge sensor a location of the given partial discharge sensor and the first partial discharge device, and confirming from an IP address of a second partial discharge device communicating with the noise sensor the location of each single noise sensor associated with each group.

4. The apparatus of claim 3, further configured to allocate channels for receiving the partial discharge data and the noise data from a given partial discharge device included in each group.

5. The apparatus of claim 4, further configured to confirm an IP or channel of the given partial discharge device that has transmitted the partial discharge data and the noise data, respectively, and to confirm which groups of the plurality of groups from which the partial discharge data and the noise data are generated based on the IP or channel of the given partial discharge device.

6. The apparatus of claim 5, further configured to, when the partial discharge data and the noise data are generated in the same group, insert a timestamp into the partial discharge data and the noise data for storage.

7. The apparatus of claim 6, further configured to analyze a pattern of the partial discharge data in which the timestamp is inserted, call noise data having the same timestamp as the partial discharge data to analyze a pattern of the noise data when a noise gate mode is activated, and compare the pattern of the partial discharge data and the pattern of the noise data.

* * * * *